United States Patent [19]

Lam

[11] Patent Number: 4,603,468

[45] Date of Patent: Aug. 5, 1986

[54] METHOD FOR SOURCE/DRAIN SELF-ALIGNMENT IN STACKED CMOS

[75] Inventor: Hon W. Lam, Dallas, Tex.

[73] Assignee: Texas Instruments Incorporated, Dallas, Tex.

[21] Appl. No.: 656,055

[22] Filed: Sep. 28, 1984

[51] Int. Cl.$^4$ .................... H01L 21/90; H01L 21/76
[52] U.S. Cl. ........................... 29/571; 29/576 J; 29/576 W; 29/578; 148/1.5; 148/188; 148/DIG. 164; 357/23.7; 357/42; 357/44; 357/59
[58] Field of Search ............... 29/571, 576 J, 576 W, 29/578; 148/191, 188, 1.5, DIG. 164; 357/23.7, 42, 44, 59

[56] References Cited

U.S. PATENT DOCUMENTS

| | | | |
|---|---|---|---|
| 4,272,880 | 6/1981 | Pashley | 29/576 B X |
| 4,467,518 | 8/1984 | Bansal et al. | 29/571 |
| 4,476,475 | 10/1984 | Naem et al. | 357/42 X |
| 4,488,348 | 12/1984 | Jolly | 29/571 |
| 4,497,108 | 2/1985 | Kurosawa | 29/576 W |
| 4,502,202 | 3/1985 | Malhi | 357/23.9 X |

Primary Examiner—Brian E. Hearn
Assistant Examiner—David A. Hey
Attorney, Agent, or Firm—Kenneth C. Hill; Douglas A. Sorensen; Robert Groover, III

[57] ABSTRACT

In stacked CMOS, a single gate in first level polycrystalline silicon is used to address both an N-channel device in the substrate and an overlaid p-channel device. The p-channel device has self-aligned source and drain regions formed by diffusing a dopant from doped regions underlying them. The doped regions are formed by planarizing a doped insulating layer, and etching the doped layer back to the upper level of the gate prior to deposition of a second polysilicon layer.

9 Claims, 4 Drawing Figures

METHOD FOR SOURCE/DRAIN SELF-ALIGNMENT IN STACKED CMOS

BACKGROUND AND SUMMARY OF THE INVENTION

The present invention relates to stacked CMOS integrated circuits, i.e., to integrated circuits containing both N-channel and P-channel insulated gate field effect devices.

It is widely recognized in the art that it would be highly desirable to achieve practical stacked CMOS integrated circuits, i.e., circuits where a single gate at a single location is capacitatively coupled to control both N-channel and P-channel devices. It is usually assumed that the N-channel devices would be formed in the substrate and the P-channel devices would be formed in polysilicon, although this is not strictly necessary.

Stacked CMOS has the potential to provide extremely dense integrated circuits, and especially to provide extremely dense memory circuits. However, known methods for fabrication of stacked CMOS structures do not permit the overlayed device to be self-aligned. That is, the mask which is used to pattern the channel region of the overlayed polysilicon is applied in a separate masking step from the patterning of the gate which must address this channel. This means that small geometry devices become unfeasible, since misalignment between the gate and channel region would introduce a disastrous spread in device characteristics.

A stacked CMOS structure is described by S. Malhi in U.S. application No. 505,155, filed June 17, 1983 and assigned to the assignee of the present application. The method described therein is not fully self-aligned, so that misalignment can occur.

Thus it is an object of the present invention to provide a method for fabricating stacked CMOS integrated circuits wherein an overlayed polysilicon device has a channel region which is fully self-aligned to a gate electrode beneath the channel region.

Therefore, according to the present invention, a doped layer is formed over an existing gate region, and planarized. This layer is then anisotropically etched until an upper surface of the gate region is exposed. Regions of the doped layer will remain over portions of the integrated circuit which are lower than the top surface of the gate region. A gate oxide is formed over the gate region, followed by a layer of polycrystalline silicon. Heating of the integrated circuit in an inert ambient causes dopant to diffuse from the doped regions into the polycrystalline silicon, thereby forming heavily doped source and drain regions within the polycrystalline silicon and defining a less heavily doped channel region directly above the gate region.

The novel features which characterize the present invention are defined by the appended claims. The foregoing and other objects and advantages of the present invention will hereinafter appear, and for purposes of illustration, but not of limitation, a preferred embodiment is described in the accompanying drawings.

BRIEF DESCRIPTION OF THE DRAWINGS

FIGS. 1-4 are not drawn to scale, in order to more readily illustrate various aspects of the present invention.

DESCRIPTION OF THE PREFERRED EMBODIMENT

Figure 1:
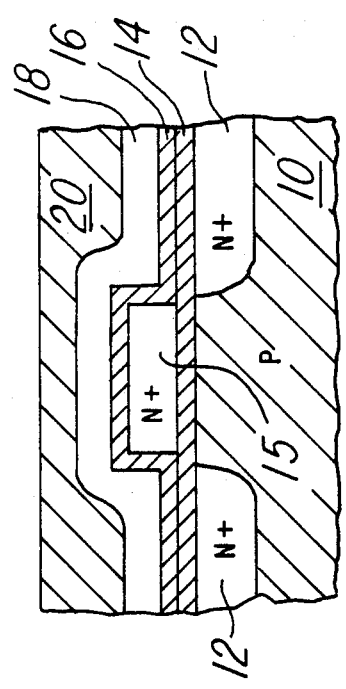

Referring to FIG. 1, a substrate 10 contains source and drain regions 12. The substrate region 10 may actually be a substrate of an integrated circuit device, or it may be a doped well located within a semiconductor substrate and isolated from remaining portions of the integrated circuit in a conventional manner. FIG. 1 shows the use of a P-type substrate 10 with N-type source and drain regions 12, although P-type source and drain regions 12 may be formed within an N-type substrate 10. On the surface of the substrate 10 and source and drain regions 12 is a thin gate oxide 14. A gate region 15, preferably of polycrystalline silicon, is protected by an oxide layer 16, which may be thermally grown or deposited in a conventional manner.

The process for fabricating the structure described thus far is conventional, and well-known to those skilled in the art. The precise method for forming a field effect transistor within the substrate 10 does not form part of the present invention.

A doped layer 18 is then formed over the insulating layer 16. This layer 18 is preferably boron doped silicate glass, and may be spun onto the integrated circuit using techniques known in the art. Phosphorus or arsenic may also be used as the dopant for the glass, with the dopant type being matched to the desired conductivity type of the upper MOS device. A planarization layer 20, such as photoresist, polyimide, or PMMA is then spun on to the integrated circuit to form a planar surface.

Figure 2:
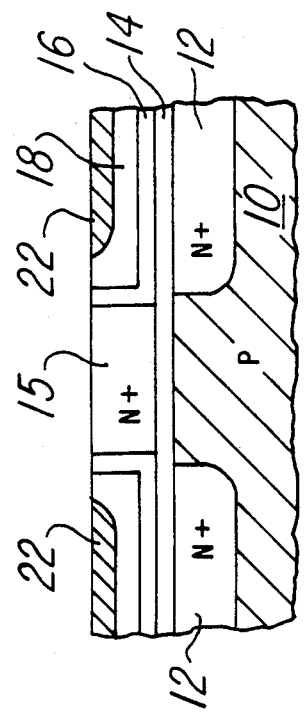

Referring to FIG. 2, and anisotropic etch is performed to expose the upper surface of the gate region 15. This leaves behind regions of the doped layer 18 which are lower than the upper surface of the gate region 15, and generally some small regions 22 of organic material. The pockets of organic material 22 are then stripped away using solvent.

Figure 3:
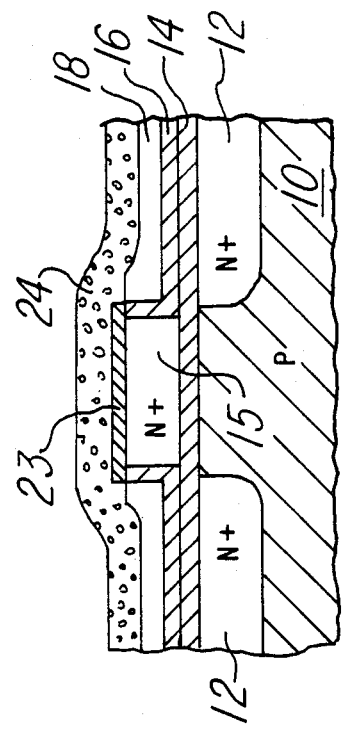
FIGS. 1-4 illustrate a preferred method for fabricating self-aligned stacked CMOS integrated circuits according to the present invention.

Referring to FIG. 3, a thin gate oxide 23 is thermally grown over the gate region 15, and a layer of lightly doped polycrystalline silicon 24 is deposited over the entire device. The polycrystalline layer 24 can be deposited with impurities, or deposited without impurities, which are added by implant. Implanted impurities will be activated by subsequent high temperature process steps. The impurity level is chosen to give the proper threshold voltage for the p-channel device.

Figure 4:
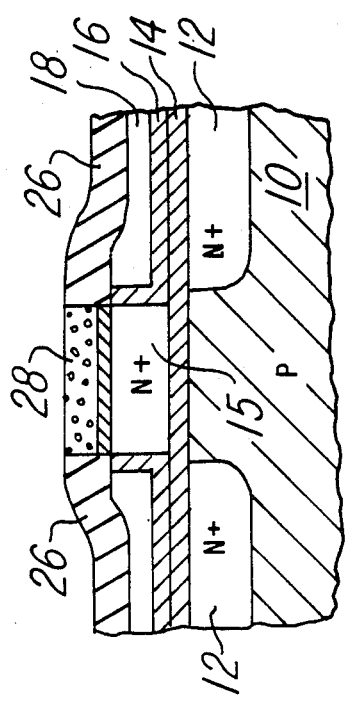

Referring to FIG. 4, the device is heated to cause diffusion of boron, phosphorus or arsenic from the doped regions 18 into the polycrystalline silicon, forming heavily doped source and drain regions 26. If an implant was made into the polycrystalline layer 24, it will be annealed by this step. A lightly doped body region 28 is defined immediately above the gate region 15 where no boron diffuses into the polysilicon. Further processing, such as passivation, metallization, and formation of contacts, is then done in a conventional manner.

In a variation of the preferred embodiment, a much thicker doped layer 18 is initially formed. The boron doped silicate glass planarizes itself to a certain extent, so that sidewall doped regions 18 are left behind when the glass layer is etched back to expose the gate region 15. This alternative method avoids the necessity of forming an organic layer 20, and removing pockets of organic material 22 prior to the gate oxide 23 formation.

The present invention has been illustrated by the process steps described above, and it will become apparent to those skilled in the art that various modifications and alterations may be made thereto. Such variations fall within the spirit of the present invention, the scope of which is defined by the appended claims.

What is claimed is:

1. A process for fabricating a self-aligned stacked CMOS structure, comprising the steps of:
   (a) fabricating source and drain regions having a first conductivity type in a substrate having a second conductivity type;
   (b) fabricating a gate region on the surface of the substrate having a sidewall oxide;
   (c) forming a first insulating layer containing a dopant of the second conductivity type on the surface of said substrate with an upper surface of the gate region exposed;
   (d) forming a second insulating layer over said exposed surface of said gate;
   (e) forming a polycrystalline silicon layer over the first and second insulating layers; and
   (f) causing dopant from the first insulating layer to diffuse into the polycrystalline layer thereover to form heavily doped upper source and drain regions in the polycrystalline silicon, the portion of the polycrystalline layer therebetween being relatively lightly doped.

2. The method of claim 1, wherein the first conductivity type is n-type, and the second conductivity type is p-type.

3. The method of claim 2, wherein the insulating layer dopant is boron.

4. The method of claim 1, wherein the first conductivity type is p-type, and the second conductivity type is n-type.

5. The method of claim 4, wherein the insulating layer dopant is phosphorus or arsenic.

6. The method of claim 1, wherein step (c) comprises the steps of:
   (f) forming an insulating layer over the source, drain, and gate regions;
   (g) etching the insulating layer until an upper surface of the gate region is exposed; and
   (h) forming a gate oxide on the exposed gate region upper surface.

7. The method of claim 1, wherein step (c) comprises the steps of:
   (i) forming an insulating layer over the source, drain, and gate regions;
   (j) forming a planarization layer over the insulating layer;
   (k) etching the planarization layer and the insulating layer until an upper surface of the gate region is exposed;
   (l) removing all remaining portions of the planarization layer; and
   (m) forming a gate oxide on the exposed gate region upper surface.

8. The method of claims 6 or 7, wherein the insulating layer comprises boron-doped silicate glass.

9. The method of claims 6 or 7, wherein the insulating layer comprises phosphorus doped silicate glass or arsenic doped silicate glass.

* * * * *